United States Patent [19]

Burstein et al.

[11] 4,394,751

[45] Jul. 19, 1983

[54] LOW POWER STORAGE CELL

[75] Inventors: Steve Burstein, Bayshore; Jay Popper, Kew Gardens, both of N.Y.

[73] Assignee: Standard Microsystems Corporation, Hauppauge, N.Y.

[21] Appl. No.: 200,085

[22] Filed: Oct. 23, 1980

[51] Int. Cl.$^3$ ............................................. G11C 7/00
[52] U.S. Cl. .................................. 365/227; 365/190; 365/154
[58] Field of Search ..................... 365/154, 190, 227; 307/279

[56] References Cited

U.S. PATENT DOCUMENTS

| | | | |
|---|---|---|---|
| 3,284,782 | 11/1966 | Burns | 365/227 |
| 3,292,008 | 12/1966 | Rapp | 365/227 |
| 3,588,846 | 6/1971 | Linton et al. | 365/227 |
| 4,120,047 | 10/1978 | Varadi | 365/227 |

OTHER PUBLICATIONS

Palfi, "Bilevel Powered FET Memory Cell", IBM Tech. Disc. Bull., vol. 14, No. 1, 6/71, pp. 261–262, 365/227.

Primary Examiner—Stuart N. Hecker
Attorney, Agent, or Firm—Hopgood, Calimafde, Kalil, Blaustein & Judlowe

[57] ABSTRACT

A low power storage cell includes a flip-flop circuit along with associated circuitry to place the flip-flop in an access mode for reading data and in a storage mode when the flip-flop is not being accessed. In the storage mode the flip-flop stores data at very low voltage and current levels, thus greatly reducing power consumption. Reduced power consumption in the storage mode permits the device to retain data for long periods of time, in the event of power failure, with minimal backup power supply capacity.

5 Claims, 4 Drawing Figures

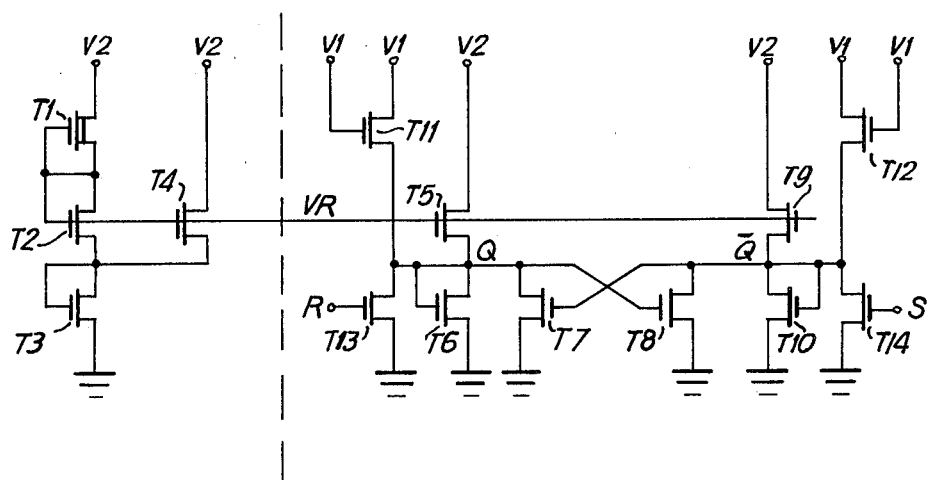
FIG. 1
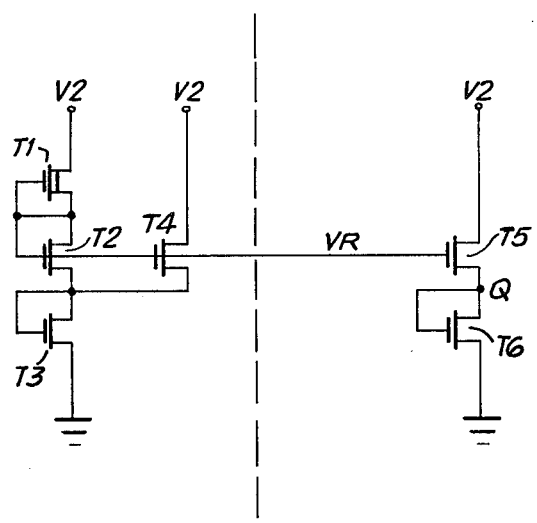
FIG. 2
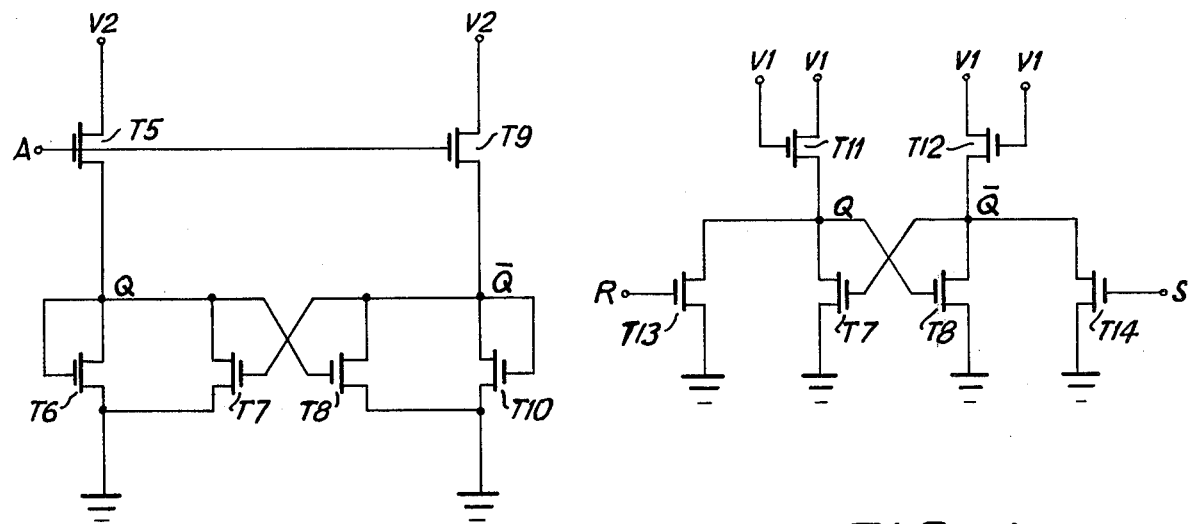
FIG. 3
FIG. 4

LOW POWER STORAGE CELL

FIELD OF THE INVENTION

This invention relates to digital logic circuits and more particularly to a very low power dual mode storage cell for use in digital circuitry.

DESCRIPTION OF THE PRIOR ART

A major goal of digital circuit designers has always been the reduction of circuit power consumption. This goal has been attained to a large degree with the advent of new processing techniques and structural configurations in the metal-oxide-silicon (MOS) field effect transistor (FET) technology used to fabricate modern large scale integrated circuits. In particular, the relatively recent advances in the area of complementary MOS (CMOS) technology have enabled circuit designers to create circuits with higher operating speeds, greatly increased packing density and relatively low power dissipation.

Notwithstanding the advances in reducing circuit power consumption a major problem area remains and that is in reducing the power consumption of the standard flip-flop. This problem has been difficult to overcome for two reasons. First, the flip-flop is the basic building block in digital circuitry and therefore even a minor increase in power consumption for an individual flip-flop results in a large increase in power consumption for the complete digital circuit. Second, the flip-flop circuit stores logic levels by turning one of the two flip-flop transistors fully ON and the other transistor fully OFF. The transistor that is fully ON of course draws maximum current greatly adding to the power consumption of the flip-flop and the entire digital logic circuit.

It is therefore an object of the present invention to reduce the power consumption of the standard flip-flop type of digital logic storage cell.

SUMMARY OF THE INVENTION

In accordance with the invention a storage cell comprises a flip-flop circuit having first and second transistors, one terminal of each of said transistors being connected to cell ground potential, a second terminal of each of said transistors being connected to cell supply voltage, a third terminal of said first transistor being connected to the second terminal of said second transistor and a third terminal of said second transistor being connected to the second terminal of said first transistor.

It is a feature of the invention that the storage cell has two modes of operation, a nominal power access mode and a low power storage mode.

It is a further feature of the invention that the storage cell is placed in the access mode by applying a supply voltage of a first potential level to the flip-flop circuit, and is placed in the storage mode by removing the first potential level and by applying a supply voltage of a second potential level to the flip-flop circuit, the second potential level being substantially less than the first potential level.

It is a still further feature of the instant invention that the storage cell is normally in the storage mode and relatively infrequently in the access mode whereby total power consumption of the flip-flop is substantially reduced.

The foregoing and other objects and features of this invention will be more fully understood from the following description of an illustrative embodiment thereof in conjunction with the accompanying drawings.

BRIEF DESCRIPTION OF THE DRAWINGS

In the Drawings:

FIG. 1 illustrates a low power storage cell in accordance with the instant invention;

FIG. 2, illustrates a voltage reference circuit and one portion of the storage cell's flip-flop circuit;

FIG. 3, illustrates the storage cell configuration when placed in a storage mode; and FIG. 4, illustrates the storage cell configuration when placed in an access mode.

DETAILED DESCRIPTION

The low power storage cell of the instant invention is illustrated in FIG. 1. The storage cell consists of a voltage reference source comprising transistors T1 through T4, a flip-flop circuit comprising transistors T7 and T8, a first supply voltage source comprising voltage source V1 and transistors T11 and T12, a second supply voltage source comprising voltage source V2 and transistors T5, T6, T9 and T10, a transistor T14 for placing the storage cell in the SET state and a transistor T13 for placing the storage cell in the RESET state.

The storage cell of the instant invention operates in two modes, an access mode during which information is applied to or retrieved from the cell and a storage mode during which information contained in the storage cell is maintained at a logic '1' level or a logic '0' level. During the access mode voltage is applied to the cell from voltage source V1 via transistors T11 and T12. In this mode of operation the storage cell operates at standard logic levels, preferably 3 volts, such that information can be placed into the cell or retrieved from the cell at normal logic levels. In the storage mode voltage is applied to the cell from voltage source V2 and via transistors T5 and T9. In this mode of operation the cell has extremely low power consumption as will be detailed hereinafter, and stores data with only a few tenths of a volt differential between a logic '1' level and a logic '0' level.

Operation of the low power storage cell of the instant invention is best understood by examining it in sections. For purposes of this discussion assume that the flip-flop circuit (T7 and T8) is initially placed in the SET state and that voltage V1 is being applied to the cell via transistors T11 and T12. Placing the flip-flop circuit in the SET state is achieved by applying a voltage to the gate of transistor T14, turning this transistor ON, and thereby forcing node Q to cell ground potential, which corresponds to a logic '0' level. Placing node Q at ground potential turns off transistor T7 thereby placing node $\bar{Q}$ at essentially the V1 voltage level (V1-VTE). Conversely, of course, the flip-flop circuit can be placed in the RESET mode by applying a voltage potential to transistor T13, thereby forcing node $\bar{Q}$ to cell ground potential. This turns transistor T8 OFF, raising node Q to essentially the potential of supply voltage V1 (V1-VTE). In accordance with the instant invention, it is preferred that all transistors are Metal Oxide Silicon (MOS), Field Effect Transistors (FET). As is well known in the art MOSFET transistors contain a drain, source and gate area wherein the drain and source are separated by a channel area. Channel length is defined as the distance between drain and source. Channel width is defined as the width of the channel area in the MOSFET device and aspect ratio is defined as the ratio of channel width to channel length.

The low power storage cell of the instant invention is placed in the storage mode by powering down voltage V1, thereby turning off transistors T11 and T12. In this mode of operation supply V1 is disabled and voltage source V2 supplies power to the storage cell circuitry. FIG. 2 illustrates node Q of the flip-flop circuit along with the voltage reference source, transistors T1 through T4. It is to be understood that only one voltage reference source is required regardless of the number of storage cells used. Referring now to the voltage reference source, transistor T1 functions as a load resistor and determines the current supplied by the voltage reference source. In accordance with the instant invention it is preferred that the channel length of T2 is equal to the channel length of T5, and the channel length of T3 is equal to the channel length of T6. In addition, it is preferred that the aspect ratio of T2 to T3 is equal to the aspect ratio of T5 to T6. With this preferred configuration voltage potential VR, applied to the gate of transistor T5, will ensure that node Q will be above the threshold voltage of transistor T6. Accordingly, the current in T6 will be defined by the current in T1 multiplied by the aspect ratio of T6 to T3. The voltage at node Q, in the storage mode, is designed to be 0.2 volts above the threshold voltage of transistor T6. In addition, the current in transistor T6 is designed to be a few nanoamps. Transistor T4 aids in stabilizing the reference voltage.

Referring now to FIG. 3, therein is illustrated the operative circuit of the low power storage cell in the storage mode. As previously described node Q, and accordingly, the drain and gate of transistor T6 is just above threshold voltage. Transistors T7 and T8 are specifically designed to have a shorter channel length and a wider channel width than transistors T6 and T10. As node Q is above threshold, not only is transistor T6 turned ON, but transistor T8 is also turned ON. The aspect ratio of transistor T8 compared to the aspect ratio of transistor T6 ensures that transistor T8 will be sinking much more current than transistor T6. Accordingly, node $\bar{Q}$ is below threshold voltage, transistors T6 and T8 are turned ON, and transistors T7 and T10 are turned OFF. The flip-flop circuit (T7 and T8) is therefore in a stable state. As discussed above transistors T5 and T9 are current sources driven by the reference voltage VR from the reference voltage supply.

From the preceding analysis it can be seen that the low power storage cell, when in the storage mode, utilizes only a few tenths of a volt to differentiate between a logic '1' level and a logic '0' level. That is, a logic '1' stored in the flip-flop circuit is equal in voltage to the difference between the voltage drop across transistor T6 and the voltage drop across transistor T8. As transistor T8 is turned on "harder" than transistor T6, node Q will be at a higher voltage level than node $\bar{Q}$ resulting in the storage of a logical '1' level. Conversely, of course, when the flip-flop circuit is in the opposite RESET state, node $\bar{Q}$ would be a few tenths of a volt higher than node Q in that transistor T7 would be sinking more current than transistor T10 thereby pulling node Q down to cell ground potential.

It is, of course, the logic '0' side of the flip-flop circuit that is responsible for most of the current flow and therefore responsible for the majority of power consumed. In the embodiment of FIG. 3, the current through transistor T8 is much greater than the current through transistor T6. As discussed above the current through transistor T6 is designed to be a few nanoamps. Accordingly the current through transistor T8 can easily be less than 0.5 microamps. Therefore, while in the storage mode, the low power storage cell of the instant invention consumes very little power.

Since the voltages in the storage mode are at such a low level it would be difficult to read or write data while the storage cell remains in this mode. Accordingly, when reading or writing data, the storage cell is placed in the access mode. This is accomplished, as illustrated in FIG. 4, by powering up V1 and thereby turning transistors T11 and T12 ON. Turning transistors T11 and T12 ON causes the emergence of a standard flip-flop which behaves like a sense amplifier until normal logic levels are returned to nodes Q and $\bar{Q}$. It is to be understood that, in normal operation, the low power storage cell of the instant invention is primarily in the storage mode, thus making overall power consumption extremely low. Reducing power consumption in the storage mode permits the device to retain data for long periods of time, in the event of power failure, with minimal back-up power supply capacity. The back-up supply could be a battery, for long term storage, or a simple charged capacitor for shorter storage periods.

Although a specific embodiment of this invention has been shown and described, it will be understood that various modifications may be made without departing from the spirit of the invention.

We claim:

1. A dual low power storage cell operable in an access mode and a storage mode and comprising, a flip-flop circuit having first and second transistors, a first terminal of each of said transistors being connected to cell ground potential, a second terminal of each of said transistors being connected to cell supply voltage, a third terminal of said first transistor being connected to the second terminal of said second transistor and a third terminal of said second transistor being connected to the second terminal of said first transistor, first and second voltage sources, first switch means operatively connected to said first voltage source and to said second terminal of said first and second transistors and effective when in an "on" state to place the storage cell in the access mode by applying a supply voltage of a first voltage level to said flip-flop circuit, second switch means operatively connected to said second voltage source and to said second terminal of said first and second transistors for placing the storage cell in a storage cell in the storage mode by applying a supply voltage of a second voltage level to said flip-flop circuit, said second voltage level being substantially less than said first voltage level, and means for placing said first switching means in an "off" state, thereby removing said first voltage level from said flip-flop circuit, when the storage cell is in its said storage mode.

2. The dual mode low power storage cell in accordance with claim 1, wherein said second switch means includes means responsive to said second voltage source for generating said second voltage level, and a third transistor, two terminals of said third transistors being connected to said cell supply voltage and to the second terminal of said first transistor, and a third terminal of said third transistor being connected to cell ground potential.

3. A dual mode low power storage cell in accordance with claim 2, wherein said first, second and third transistors are metal-oxide-semiconductor field-effect transistors having drain and source regions and a channel region extending between said drain and source regions, the channel region of said third transistor being narrower and longer than the channel regions of said first and second transistors.

4. A dual mode low power storage cell in accordance with claim 3, wherein there is further included a fourth transistor, said fourth transistor having two terminals connected to cell supply voltage and to the second terminal of said second transistor and having a third terminal connected to cell ground potential.

5. A dual mode low power storage cell in accordance with claim 4, wherein said fourth transistor is a metal-oxide semiconductor field-effect transistor, a channel region of said fourth transistor being narrower and longer than the channel regions of said first and second transistors and being substantially equal in width and length to the channel region of said third transistor.

* * * * *